United States Patent [19]

Naruke

[11] Patent Number: 5,375,094
[45] Date of Patent: Dec. 20, 1994

[54] NONVOLATILE SEMICONDUCTOR MEMORY SYSTEM WITH A PLURALITY OF ERASE BLOCKS

[75] Inventor: Kiyomi Naruke, Kanagawa, Japan

[73] Assignee: Kabushiki Kaisha Toshiba, Kawasaki, Japan

[21] Appl. No.: 77,390

[22] Filed: Jun. 17, 1993

[30] Foreign Application Priority Data

Jun. 19, 1992 [JP] Japan ............................. 4-160567

[51] Int. Cl.⁵ .............................................. H01L 29/76
[52] U.S. Cl. ......................................... 365/222; 365/218; 365/185; 365/230.03
[58] Field of Search ........... 365/222, 218, 185, 230.03; 371/13

[56] References Cited

U.S. PATENT DOCUMENTS 4,617,660  10/1986  Sakamoto .......................... 371/13

FOREIGN PATENT DOCUMENTS 56-77985  6/1981  Japan .
2-257497  7/1990  Japan .
2-257498  7/1990  Japan .
3-69099   4/1991  Japan .

OTHER PUBLICATIONS

Semiconductor Memories Second Edition, Betty Prince, John Wiley & Sons, pp. 319-321 and 589-594.

Primary Examiner—Viet Q. Nguyen
Attorney, Agent, or Firm—Oblon, Spivak, McClelland, Maier, & Neustadt

[57] ABSTRACT

A nonvolatile semiconductor memory system including a memory cell array (1) having a plurality of floating gate memory cell transistors (MC) arranged in a matrix of rows and columns with plurality of bit lines (BL) connected to the drains of the floating gate memory cell transistors arranged in a same column and a plurality of word lines (WL) connected to the control gates of the floating gate memory cell transistors in a same row, and a refresh circuit for periodically refreshing the stored data in the floating gate memory cell transistor.

10 Claims, 10 Drawing Sheets

NONVOLATILE SEMICONDUCTOR MEMORY SYSTEM WITH A PLURALITY OF ERASE BLOCKS

BACKGROUND OF THE INVENTION

1. Field of the Invention

This invention relates to a nonvolatile semiconductor memory system with a plurality of erase blocks.

2. Description of the Related Art

A memory cell array of a Flash Electrically Erasable Programmable Read Only Memory, or Flash EEPROM, which utilizes a one transistor memory cell, is about the same size as the Ultra Violet ray Erasable Programmable Read Only Memory, or UVEPROM. This makes the chip fabrication cost for the Flash EEPROM far smaller than that of the conventional EEPROM which utilizes a two transistor memory cell. In the Flash EEPROM, floating gate memory cell transistors are connected to a bit line without a transfer gate transistor. This is the structural barrier to achieving small sector erase operation which is long awaited by users who want to replace magnetic storage devices with the Flash EEPROM.

The Flash EEPROM has a problem called "drain disturb". This is a gradual disappearing of programmed data stored in one memory cell transistor, caused by a program operation of the other memory cell transistors which are commonly connected with the former one.

The programming operation of the Flash EEPROM is conducted by setting the drain electrode of the selected memory cell transistor to 5[V] and the control gate to 10[V], which causes hot carrier injection from the drain to the floating gate making the threshold voltage higher. To the unselected memory cell transistor which is connected to the selected bit line, the drain electrode is set to 5[V], and control gate is set to 0[V], which causes unwanted tunneling current from the floating gate to the drain. Due to this tunneling current, the threshold voltage of the unselected memory cell transistor is lowered, such that "drain disturb" occurs.

Such drain stress time is increasingly multiplied with the increase in the number of erase blocks. The worst case occurs when one memory cell transistor is programmed only once, and all other memory cell transistors connected with the former memory cell transistor by a bit line are erased and programmed 100,000 times (which is an assured limitation set by a manufacturer of the Flash EEPROM). In this case, the, drain stress time is 100,000 times longer than conventional EEPROM with only one erase block.

SUMMARY OF THE INVENTION

Accordingly, it is an object of the present invention to provide a nonvolatile semiconductor memory system with a plurality of erase blocks which avoids the "drain disturb" described above. More precisely, the object is to avoid the gradual disappearing of the old programmed data.

In accordance with the present invention, the foregoing object is achieved by providing a nonvolatile semiconductor memory system including a memory cell array having a plurality of floating gate memory cell transistors arranged in a matrix form with a plurality of bit lines connected to a drain of the floating gate memory cell transistors arranged in a same column and a plurality of word lines connected to a control gate of the floating gate memory cell transistors in a same row, a register connected to the bit lines for temporarily storing the data read from the memory cell transistors, and a refresh controller for controlling a refresh operation, including the steps of reading data from the floating gate memory cell transistors, storing the data to the register means, and over-programming the data to the floating gate memory cell transistors.

In this invention, the data stored in the memory cell transistor to which the refresh operation is conducted is enhanced by the over-programming of the same data. Therefore gradual disappearing of the old data is completely avoided.

Since the refresh operation is conducted with every, erase operation, the gradual decrease in threshold voltage by drain disturb become proportional to the gradual increase in threshold voltage by the refresh operation, giving appropriate margin of fluctuations in threshold voltage.

Further to this invention, the refresh control means includes an address counter designating the memory cell transistor to which the refresh operation is to be conducted. The address counter address, which designates the memory cell transistor to which the next refresh operation is conducted, is sequentially increased so that all of the memory cell transistors are equally refreshed.

Further to this invention, the refresh control means includes a nonvolatile address register for storing back-up address data for the address counter. The back-up address data is stored from the address counter to the nonvolatile address register before a power-down of the system and the back-up address data is loaded from the nonvolatile address register to the address counter after the power-on of this system. Alternatively, the back-up address data is stored from the address counter to the nonvolatile address register after the refresh operation is finished and the back-up address data is loaded from the nonvolatile address register to the address counter before the refresh operation begins.

In this invention, the nonvolatile address register holds, without power supply, the address data which designates the memory cell transistor to which the next refresh operation is conducted.

Other object, features, and advantages of the present invention will become apparent from the following detailed description. It should be understood, however, that various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

Figure 1:
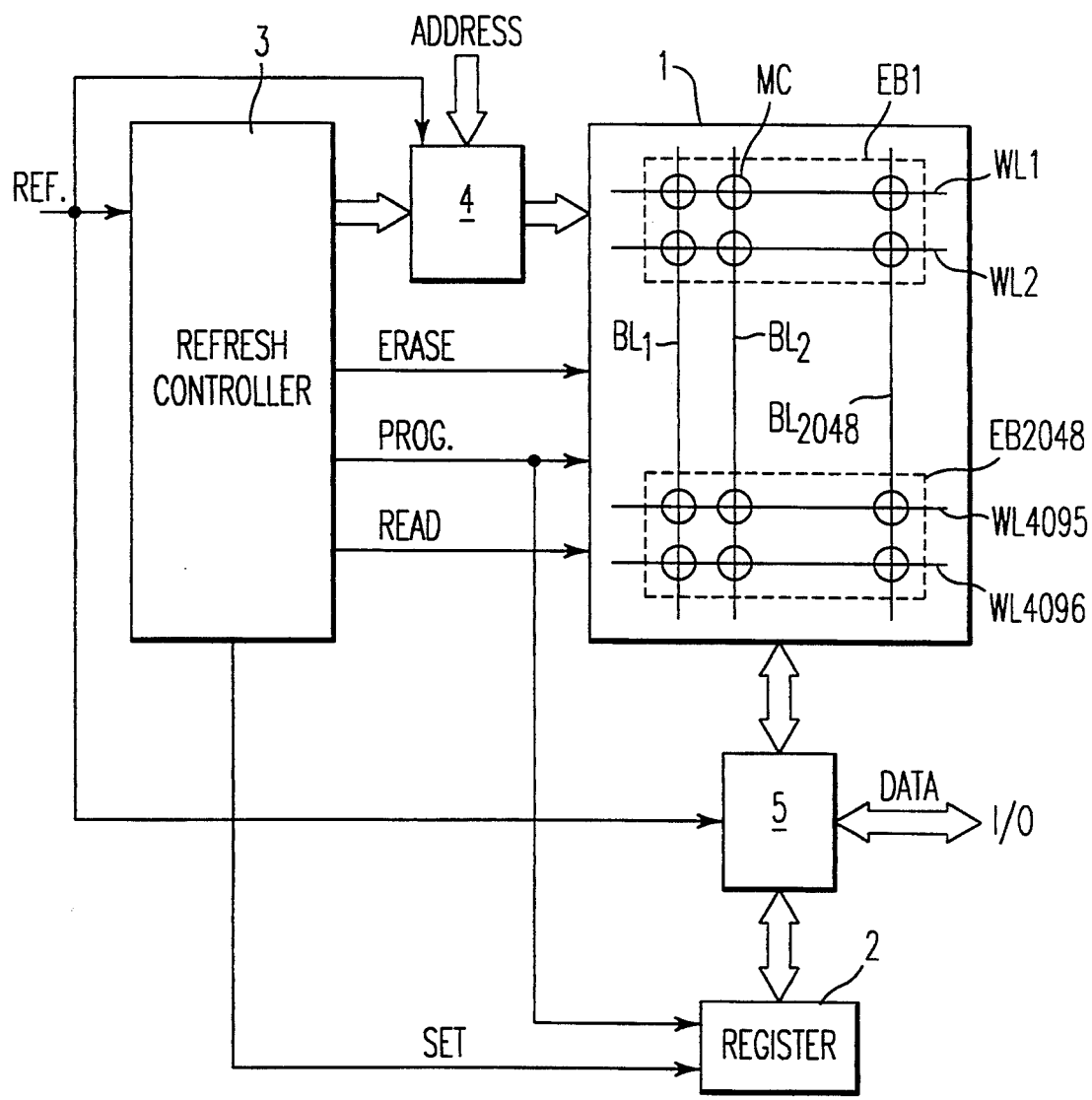
FIG. 1 is a schematic diagram of the nonvolatile memory system of the first embodiment of the present invention.

Referring now to the drawings, wherein like reference numerals designate identical or corresponding parts throughout the several views, the first embodiment of the present invention will be described with reference to FIGS. 1-8. FIG. 1 is a schematic diagram of the nonvolatile memory system of the first embodiment of the present invention. This memory system includes nonvolatile semiconductor memory device 1, register 2, refresh controller 3, address switch array 4 and data switch array 5.

The nonvolatile semiconductor memory device 1 includes an 8M-bit memory cell array of nonvolatile memory cell transistors MC arranged in 4096 rows and 2048 columns. The memory cell transistors in the same row are connected by a word line WL and those in the same column are connected by a bit line BL. The memory cell array is divided into 2048 erase blocks EB, in which the memory cell transistors in the same erase block EB are erased simultaneously. Each erase block is 4K-bit and includes two word lines WL and 4096 memory cell transistors MC.

The register 2 temporarily store the data read from the memory cell transistor MC and is connected to the nonvolatile semiconductor memory 1, more precisely to the bit line BL, by way of data switch array 5.

The refresh controller 3 outputs control signals for controlling the refresh operation. These control signals are ADDRESS, ERASE, PROG., READ and SET. ADDRESS is a 20-bit signal which is used to select eight memory cell transistors from 8 million memory cell transistors in a program/read operation and to select one erase block from 2048 erase blocks. ERASE is used to trigger an erase operation in the erase block EB which is selected by ADDRESS; PROG, is used to trigger a program operation in the selected memory cell transistors. READ is used to trigger a read operation from the selected memory cell transistors. SET is used to set the data read from the memory cell transistors to the register 2.

The refresh operation is always accompanied by the erase operation, and includes the steps of:
(1) reading data from one of the memory cell transistors MC,
(2) setting the data to the register 1, and
(3) over-programming the data in the register 1 to the same memory cell transistors MC.

The address switch array 4 controls the flow of the address signal by a REF. signal. In the refresh operation the address signal flows from the refresh controller 3 to the nonvolatile semiconductor memory device 1.

Functionally, the address switch array 4 serves to multiplex either the address of the memory cell block to be refreshed during a refresh operation or the address of the memory block to be accessed for a read/write operation.

The data switch array 5 controls the flow of the data signal by the REF. signal. In the refresh operation, the data signal flows from the nonvolatile semiconductor memory device 1 to the register 2, and vice versa. In effect, data switch array 5 serves to multiplex data to the I/O bus during data read/write, or to and from the register 2 and the memory cell transistor MC during a refresh operation.

Figure 2:
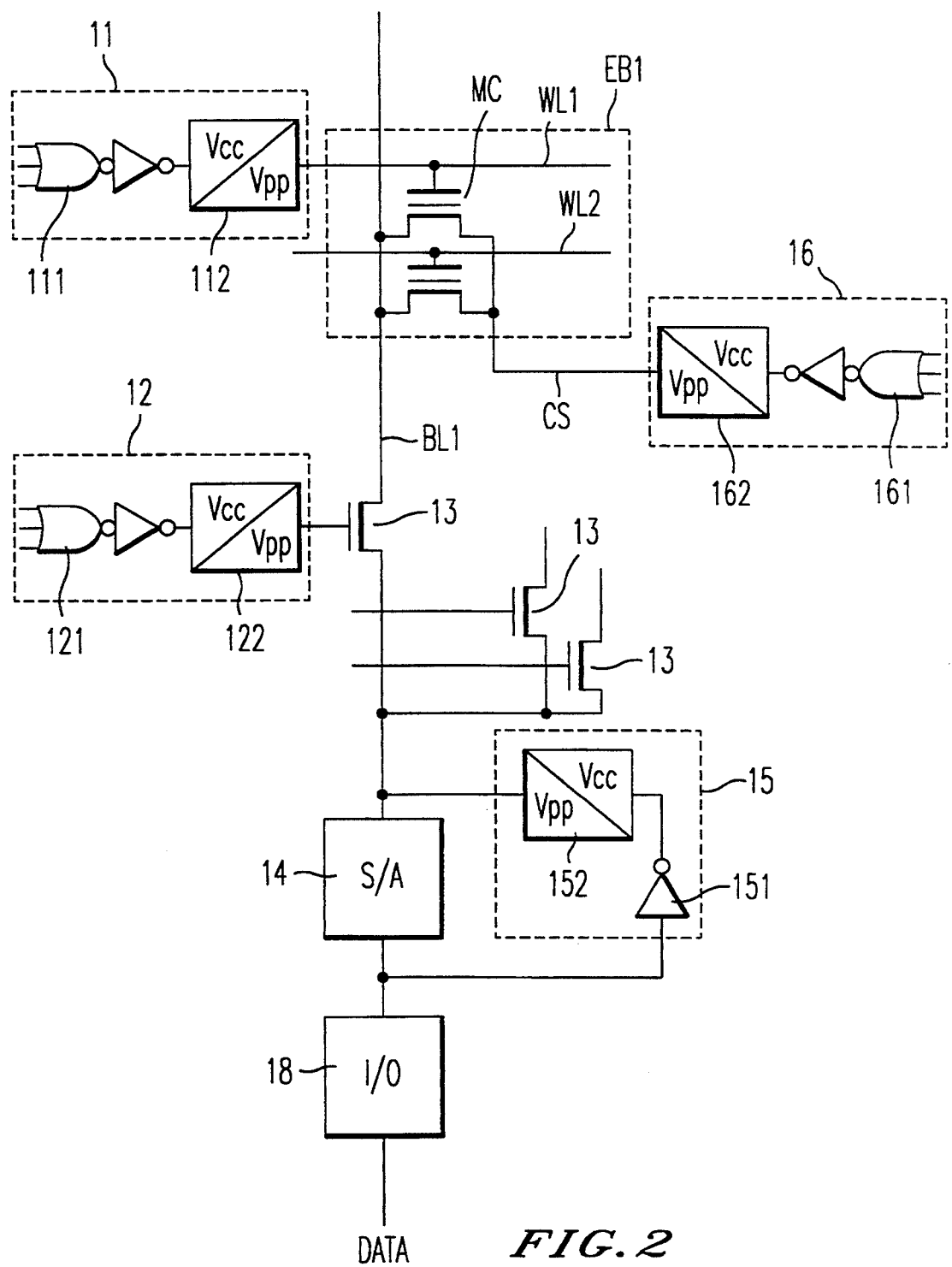
FIG. 2 is a circuit diagram of the nonvolatile semiconductor memory device shown in FIG. 1.

FIG. 2 is a circuit diagram of the nonvolatile semiconductor memory device 1 shown in FIG. 1 with reference to one bit line BL. For simplicity of description, the data switch array 5 is emitted from FIG. 2.

Every word line is connected to and is driven by word line driver circuit 11 which includes decoder circuit 111 and driver circuit 112. In a erase operation, all of word lines are set to 0[V]. In a program operation, high voltage of 10[V] is applied to the selected word line and 0[V] is applied to the unselected word lines. And in a read operation, 5[V] is applied to the selected word line and 0[V] is applied to the unselected word lines.

Every bit line is connected to a sense amplifier 14 and programming circuit 15 through column gate transistor 13 which is connected to and is driven by column gate driver circuit 12 including decoder circuit 121 and driver circuit 122. The column gate transistor 13 is used to selectively connect the bit line BL to the sense amplifier 14 and programming circuit 15. In an erase operation, all of gate electrodes of the column gate transistors are set to 0[V], producing a bit line floating condition. In an program operation, a high voltage of 10[V] is applied to the gate electrode of the selected column gate transistor and 0[V] is applied to the unselected column gate transistors. In a read operation, 5[V] is applied to the selected column gate transistor and 0[V] is applied to the unselected column gate transistors.

Sense amplifier 14 is a well known current mirror sense amplifier and is connected to the bit line through column gate transistor 13. It detects the data stored in a memory cell transistor MC and produces a corresponding detection signal which is output to register 2 through I/O buffer circuit 15 which amplifies the detection signal. Program circuit 15 includes inverter circuit 151 and driver circuit 152 and is used to produce a program voltage corresponding to input data transferred form register 2 through I/O buffer, circuit 15. In a program operation, 5[V] is applied to the bit line BL when the input data is "0" and 0[V] is applied to the bit line BL when the input data is "1".

The source electrode of all memory cell transistors in the same erase block are commonly connected to a common source line CS. Every common source line is connected to and is driven by common source line driver circuit 16 which includes decoder circuit 161 and driver circuit 162. In an erase operation, a high voltage of 10[V] is applied to the selected common source line and 0[V] is applied to the unselected common source lines. In a program/read operation, 0[V] is applied to all of the common source lines.

Figure 3:
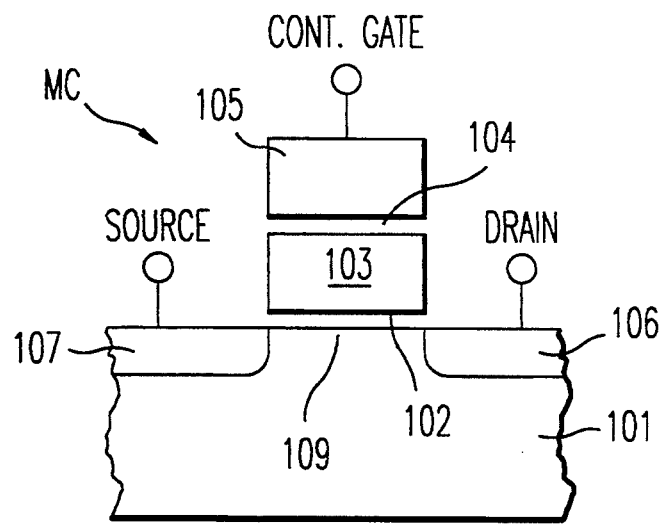
FIG. 3 is a cross-sectional view of a memory cell transistor shown in FIG. 2.

FIG. 3 is a cross-sectional view of a memory cell transistor MC shown in FIG. 2. It includes P-type substrate 101, drain region 106 and source region 107 of N-type diffusion with both regions being separated by channel region 109, a floating gate of first N-diffused polycrystalline silicon layer 103 disposed on the substrate of the channel region 109, a control gate 105 of second N-diffused polycrystalline silicon layer, first dielectric film 102 interposed between the substrate 101 and the first polycrystalline silicon layer 103 and second dielectric film 104 interposed between the first polycrystalline silicon layer 103 and the second polycrystalline silicon layer 105.

Figure 4:
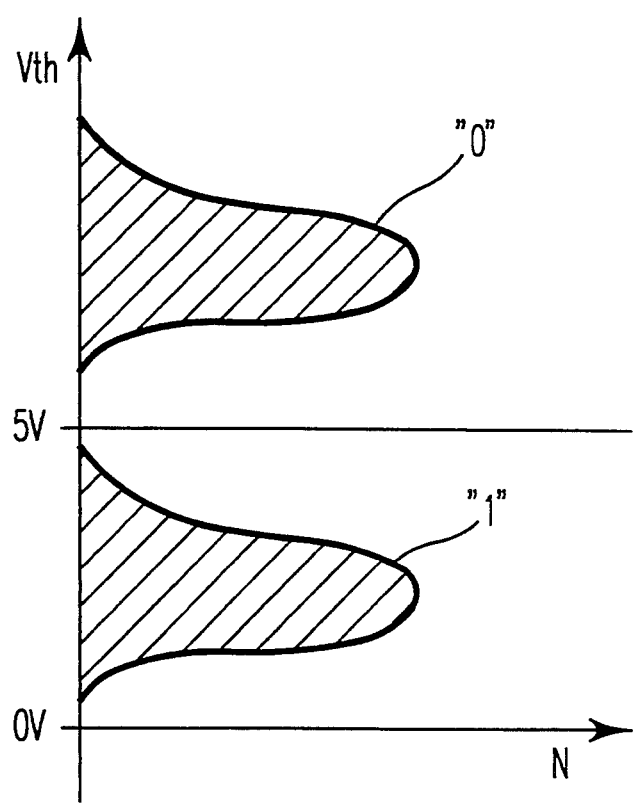
FIG. 4 is graph of the threshold voltage distribution of the memory cell transistor shown in FIG. 3.

The memory cell transistor is floating gate MOS transistor which stores binary data in its threshold voltage determined by the amount of electrons charged in the floating gate. More precisely, the threshold voltage is in a certain range corresponding to the data stored in the memory, cell transistor. When the memory cell transistor stores logic "1" data, its threshold voltage is between 0[V] and 5[V]. When the memory cell transistor stores "0" data, its threshold voltage is above 5[V]. The erase operation is designed to lower the threshold voltage to between 0[V] and 5[V]. A memory cell transistor storing "1" data is called an erased cell". The program operation is designed to increase the threshold voltage to above 5[V]. A memory cell transistor storing logic "0" data is called "programmed cell". FIG. 4 is threshold voltage distribution of the floating gate transistor shown in FIG. 3.

Figures 5, 6A:
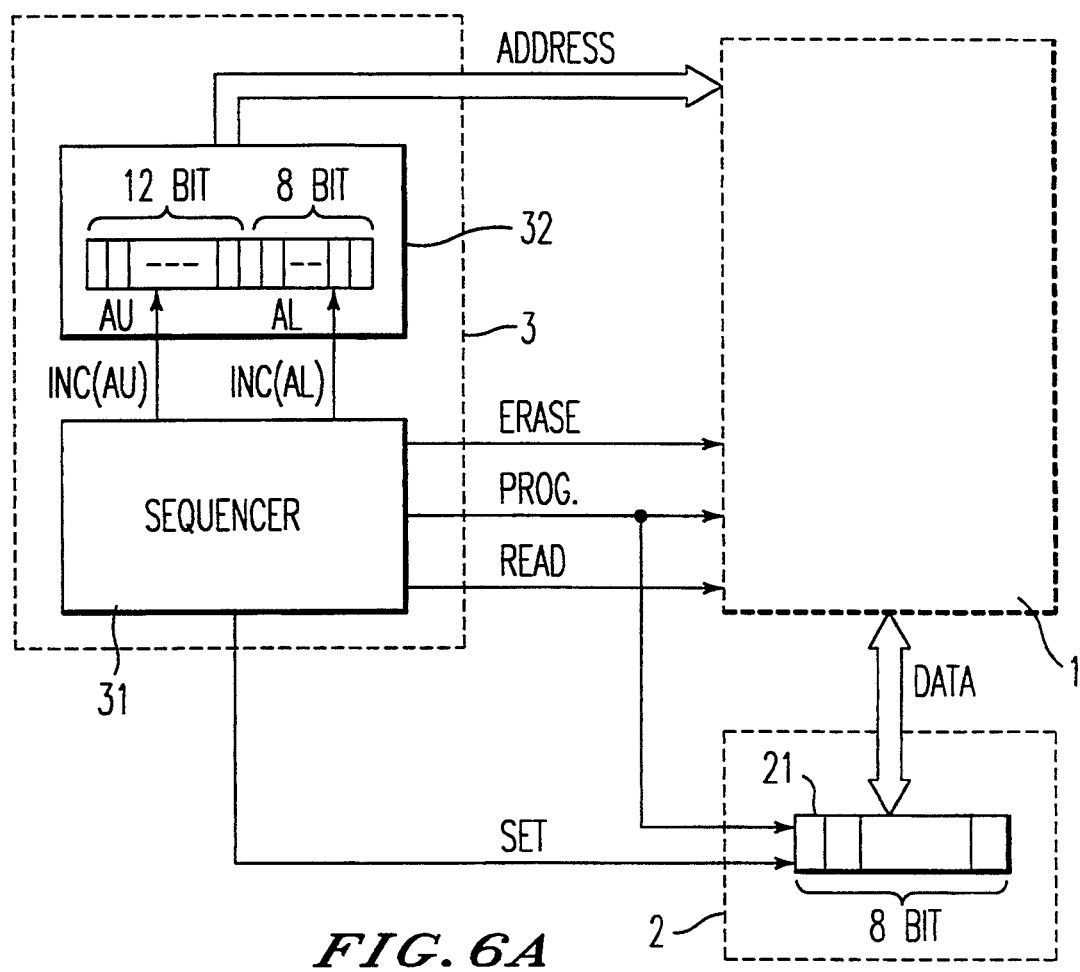
FIG. 5 is a table showing voltage-application to the source, drain and control gate in various modes.
FIG. 6A is a detailed schematic diagram of the refresh controller and the register shown in FIG. 1.

FIG. 5 is a voltage-application-table showing the level of the voltage applied to the source, drain and control gate in various operation. In a erase operation, the source electrode is set to 10[V], the drain electrode is set to floating condition and control gate is set to 0[V], which causes tunnel current from the source to the floating gate making the threshold voltage lower. In a program operation, the source electrode is set to 0[V], the drain electrode is set to 5[V] and control gate is set to 10[V], which causes hot carrier injection from the drain to the floating gate making the threshold voltage higher. In a read operation, the source electrode is set to 0[V], the drain electrode is set to 1[V] or sensing voltage and control gate is set to 5[V], which causes current path from the drain to the source with certain resistance corresponding to the threshold voltage or the stored data.

FIG. 6A is a detailed schematic diagram of the refresh controller 3 and the register 2 shown in FIG. 1. The register 2 includes 8-bit register for temporarily storing data read from the memory cells in the nonvolatile semiconductor memory device 1. The refresh controller includes 20-bit address counter 32 including 12-bit first address counter AU and 8-bit second address counter AL. The address data stored in the first address counter AU is increased when the INC(AU) signal is input and the address data stored in the second address counter AL is increased when the INC(AL) signal is input. Sequencer circuit 31 generates a control signal in accordance with the predetermined sequences.

Figure 6B:
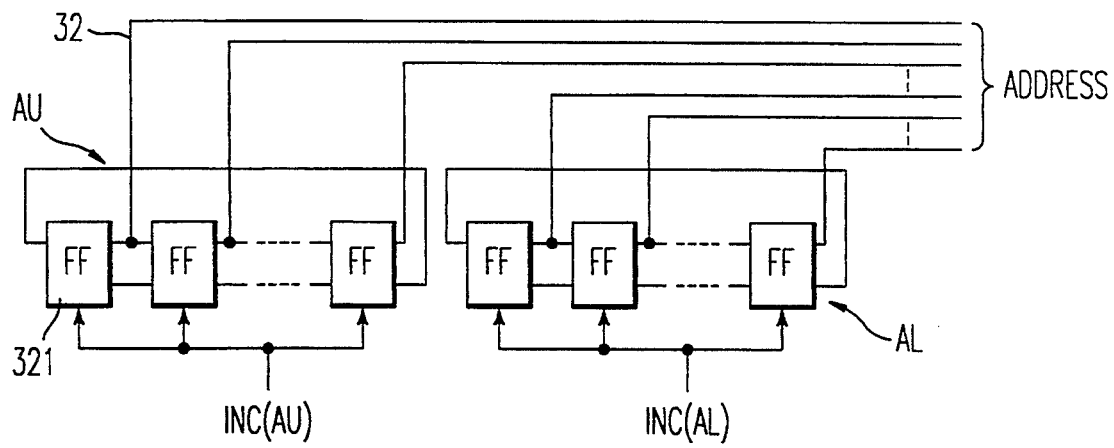
FIG. 6B is a circuit diagram of the address counter shown in FIG. 6A.

FIG. 6B is a circuit diagram of the first and second address counters shown in FIG. 6A. They include series connected J-K-flip-flop circuits which provide a cyclic counter. Address data in a 8-bit cyclic counter goes O0H, 01H, 02H . . . FEH, FFH, O0H, 01H . . . or cyclically. Address data in a 12-bit cyclic counter goes O00H, 001H. 002H . . . FFEH, FFFH, O00H, 001H . . . .

Figure 6C:
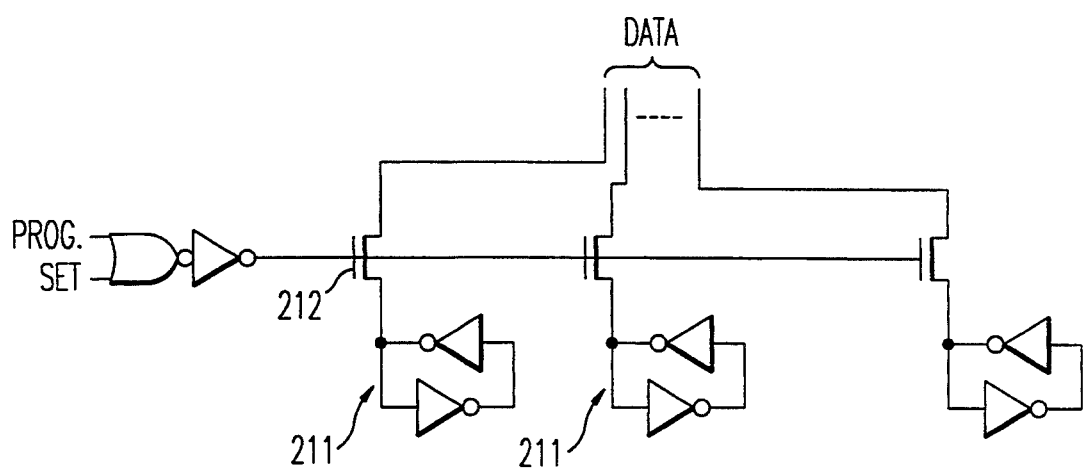
FIG. 6C is a circuit diagram of the register shown in FIG. 6A.

FIG. 6C is a circuit diagram of the register shown in FIG. 6A. The register has eight latch circuits 211 with two inverter circuits. One of the latch circuits 211 is connected to the data line through transfer gate transistor 212. The gate of transfer gate transistor 212 is driven to 5[V] with PROG. or SET signal being active.

Figure 7:
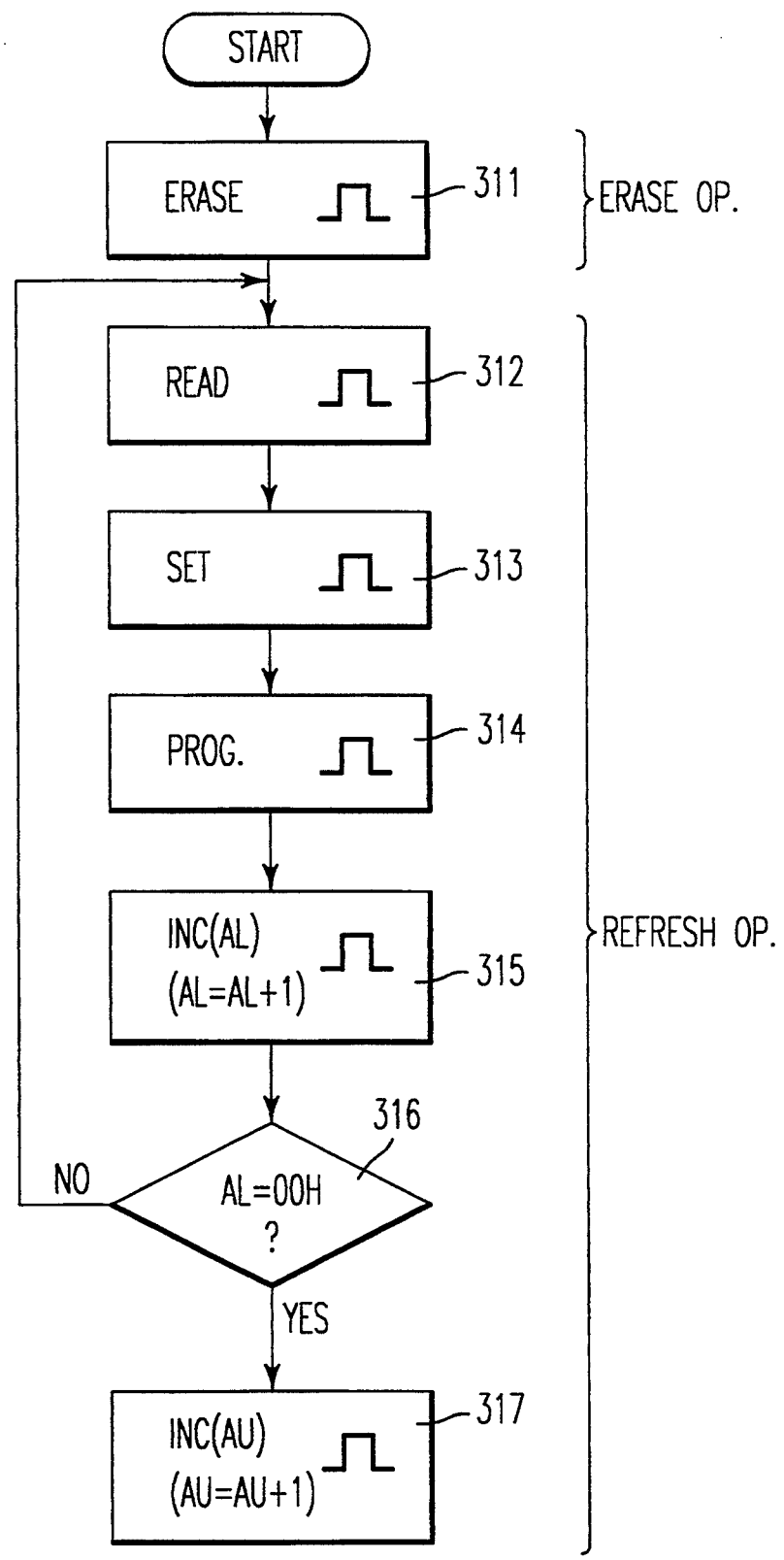
FIG. 7 is a flow chart of the erase operation showing the operation of the sequencer shown in FIG. 6A.

FIG. 7 is a flow chart in the erase operation showing the operation of the sequencer shown in FIG. 6A. As described above, sequencer 31 outputs control signals for controlling refresh operation. These control signals are ADDRESS, ERASE, PROG., READ, SET, INC(AL) and INC(AU). ERASE is used to trigger an erase operation in the erase block EB which is selected by ADDRESS. PROG. is used to trigger a program operation in the selected memory cell transistors READ is used to trigger a read operation from the selected memory cell transistors. SET is used to set the data read, from the memory cell transistors to the register 2. INC(AL) is used to trigger an increment of the address stored in 8-bit second address counter AL. INC(AU) is used to trigger an increment of the address stored in 12-bit first address counter AU.

The refresh operation which is conducted after the erase operation. In the erase mode, sequencer circuit 31 generates control signals in accordance with the predetermined sequences.

(1) The sequencer circuit 31 outputs an ERASE pulse in the first stage 311. The erase operation is triggered in the selected one of the erase blocks EB.

(2) The sequencer circuit 31 outputs a READ pulse in the second stage 312. The read operation is triggered, which results in the data stored in the memory cell transistor designated by the address in first address counter AU and in second address counter AL being read and transferred to register 2.

(3) The sequencer circuit 31 outputs a SET pulse in the third stage 313. The set operation is triggered, which sets the data in the register 2.

(4) The sequencer circuit 31 outputs a PROG. pulse in the fourth stage 314. The program operation is triggered in the memory cell transistor designated by the address in first address counter AU and in second address counter AL. The manner of the program operation is to over-program the same data already stored in the memory cell transistor putting the threshold voltage of the "0" cell, or programmed cell, higher. The threshold voltage of the "1" cell, or erased cell, is maintained at the same level. Therefore, data in the refreshed memory cell is enhanced.

(5) The sequencer circuit 31 outputs the INC(AL) pulse in the fifth stage 315. This triggers an increment of address data in second address counter AL so that the address designates the next memory cell transistor to be refreshed.

(6) The sequencer circuit 31, then in the sixth stage 316, compares the address data stored in second address counter AL to O0H. If the address data is equal to O0H, the refresh operation is to be finished going to the seventh stage 317. If not, next refresh operation begins going to the second stage 312 again.

(7) The sequencer circuit 31 then outputs an INC(AL) pulse in the seventh stage 317. This triggers an increment of address data in first address counter AL making the address designate the next memory cell transistor to be refreshed.

Figure 8:
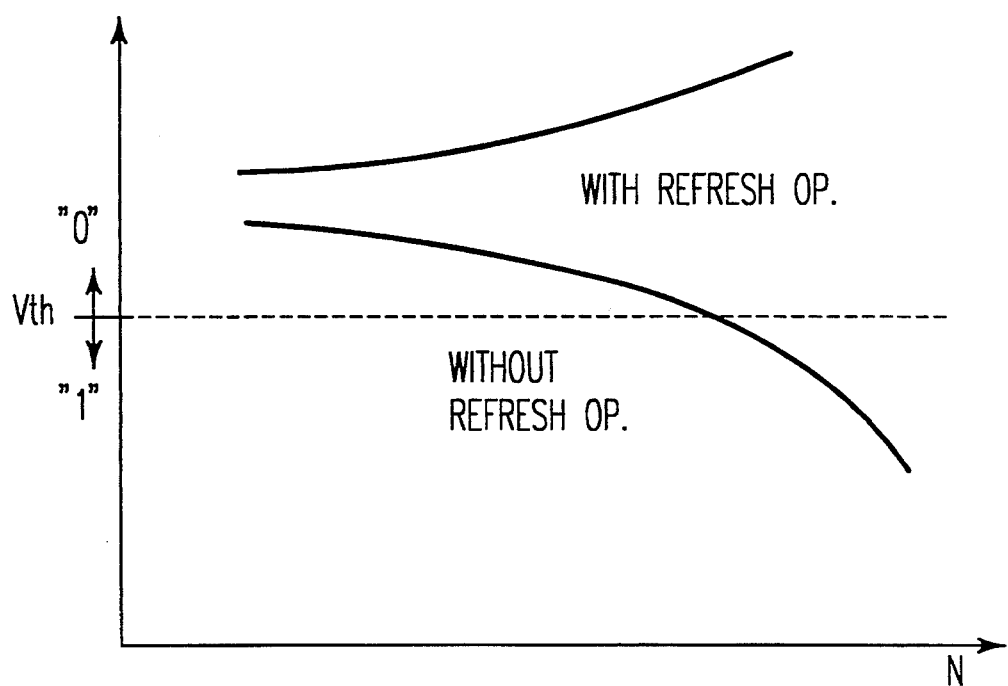
FIG. 8 is a graph showing a fluctuation of the threshold voltage characteristic of the memory cell transistor in this invention compared to the prior art.

FIG. 8 is a graph showing a characteristic of the fluctuations in the threshold voltage of the memory cell transistor which stores "0" data, or an erased memory cell, in this invention compared to the prior art. As the number of the program/erase cycles increase, the threshold voltage of the memory cell transistor in the conventional memory system without a refresh operation is lowered gradually. Under certain conditions, the threshold voltage becomes lower than 5[V] making the stored data inverted. On the contrary, the fluctuations in threshold voltage of the memory cell transistor in the memory system of the present invention are very small. Furthermore, the data is being enhanced gradually. Since the refresh operation is conducted sequentially with every erase operation, the gradual decrease in threshold voltage by drain disturb becomes proportional to the gradual increase in threshold voltage by the refresh operation, giving appropriate margin of fluctuations in threshold voltage. Therefore the enhancement is not so large as shown in FIG. 8, avoiding an unwanted increase in threshold voltage that gives stress to the gate insulation films in the memory cell transistor.

Figure 9:
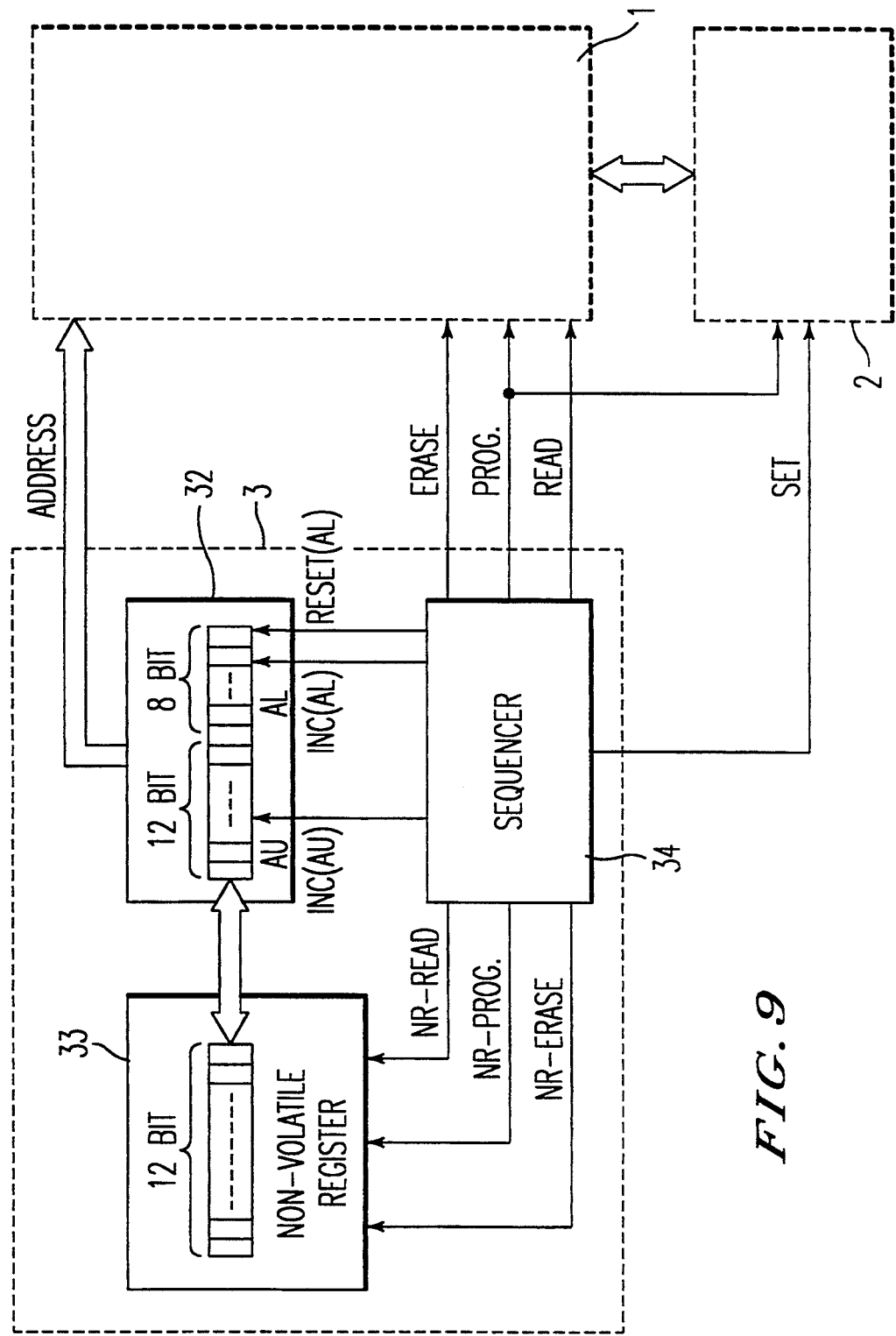
FIG. 9 is a detailed schematic diagram of the refresh controller and the register of the second and the third embodiment of the present invention.

FIG. 9 is a detailed schematic diagram of the refresh controller of the second and the third embodiment of the present invention. The refresh controller 3 includes 20-bit address counter 32 including a 12-bit first address counter AU and an 8-bit second address counter AL. The address data, stored in the first address counter AU is increased when the INC(AU) signal is input and the address data stored in the second address counter AL is increased when the INC(AL) signal is input. The data stored in the second address counter is reset to OOH by the RESET(AL) signal. Sequencer circuit 31 generates control signals in accordance with the predetermined sequences. The refresh controller 3 further includes a 12-bit nonvolatile address register 33 connected to first address counter AU. A NR-READ pulse triggers the data stored in nonvolatile address register 33 being read and transferred to first address counter AU. A NR-PROG. pulse triggers the data stored in first address counter AU being transferred to and saved in nonvolatile address register 33. A NR-ERASE pulse triggers the erase operation of the nonvolatile register.

Figure 10A:
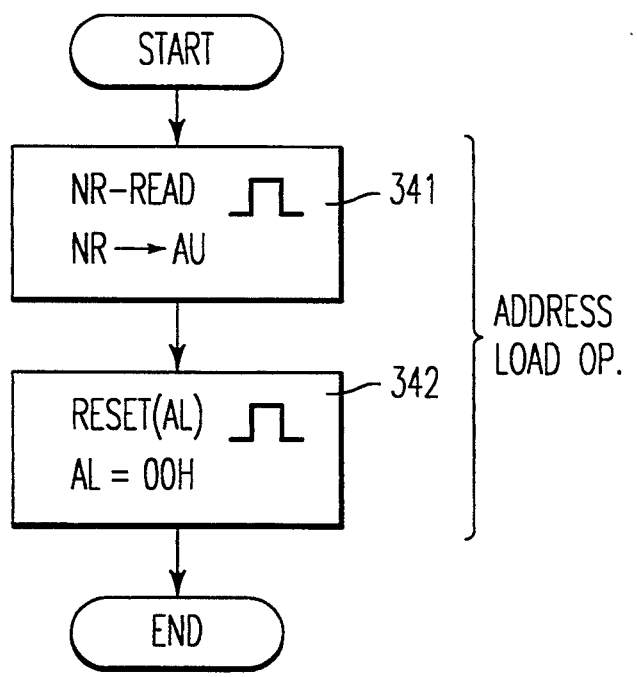
FIG. 10 is a flow chart in the POWER-ON and the POWER-, DOWN operation showing the operation of the sequencer shown in FIG. 9.
Figure 10B:
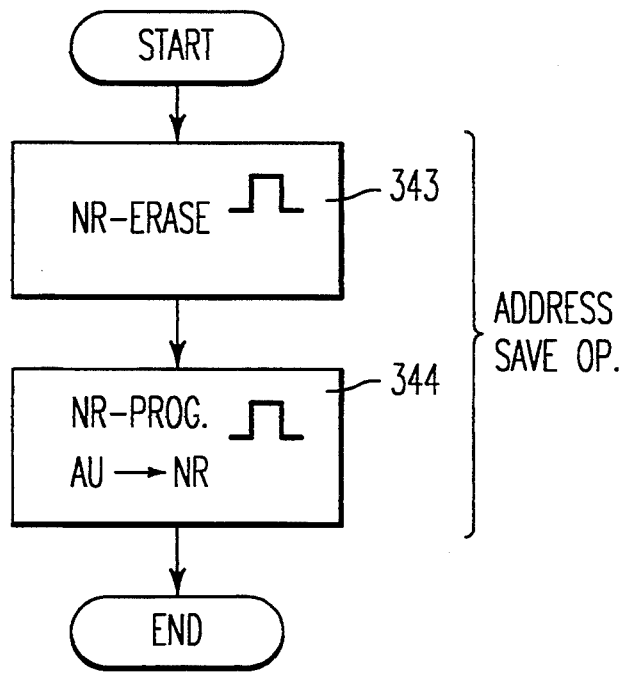
Figure 11:
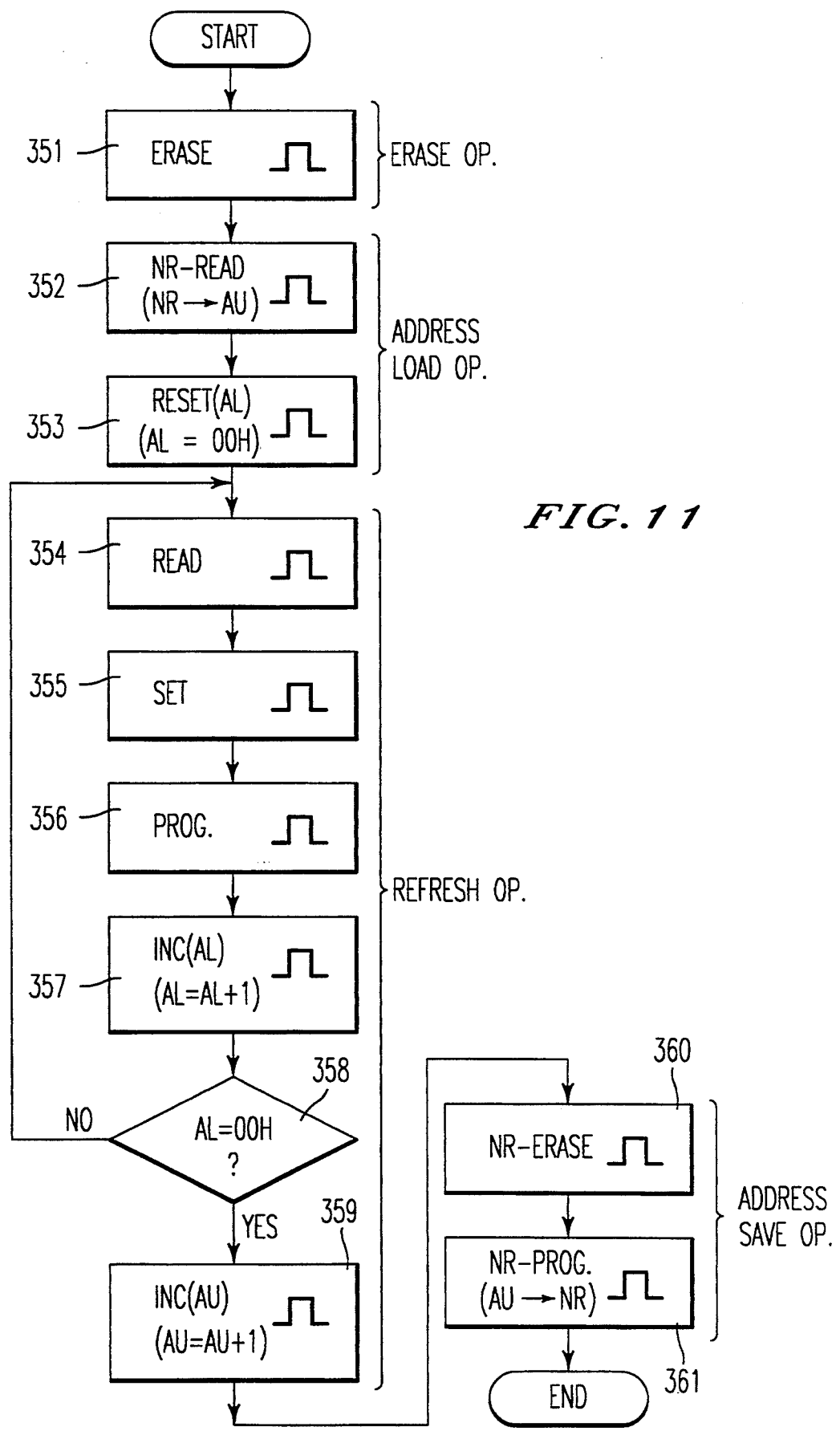
FIG. 11 is a flow chart of the erase operation showing the operation of the sequencer shown in FIG. 9.

FIG. 10 is a flow chart in the POWER-ON and the POWER-DOWN operation showing the operation of the sequencer shown in FIG. 9.

With the power-on of this system, address data stored in the nonvolatile register is loaded to the first address counter. In the POWER-ON mode, sequencer circuit 31 generates some control signals in accordance with the following predetermined sequences:

(1) The sequencer circuit 31 outputs the NR-READ pulse in the first stage 341. The data stored in nonvolatile address register 33 is read and transferred to first address counter AU.

(2) The sequencer circuit 31 then outputs the RESET(AL) pulse in the second stage 342. The data stored in second address counter AL is reset to OHH designating a certain memory cell transistor to be refreshed.

With the power-down of this system, address data stored in the first address counter is saved to the nonvolatile address register. In the POWER-DOWN mode, sequencer circuit 31 generates control signals in accordance with predetermined sequences. That is:

(1) The sequencer circuit 31 outputs the NR-ERASE pulse in the first stage 343. The data in nonvolatile address register 33 is erased.

(2) The sequencer circuit 31 then outputs the NR-PROG. pulse in the second stage 344. The data stored in first address counter AL is transferred to and saved in nonvolatile register 33.

As described above, in the second embodiment of this invention, the refresh controller 3 includes nonvolatile address register 33 for storing back-up address data for the address counter. The back-up address data is stored from the address counter to the nonvolatile address register before the power-down of this system and the back-up address data is loaded from the nonvolatile address register to the address counter after the power-on of this system. Therefore, the nonvolatile address register holds, without power supply, the address data which designates the memory cell transistor to which the next refresh operation is to be conducted.

FIG. 10 is a flow chart in the erase operation showing the operation of the sequencer in the third embodiment of this invention.

The refresh operation is conducted after the erase operation. In the erase mode which consists of an erase operation, address load operation, refresh operation and address save operation, sequencer circuit 31 generates control signals in accordance with the following predetermined sequences:

(1) The sequencer circuit 31 outputs the ERASE pulse in the first stage 351. The erase operation is triggered to the selected one of the erase blocks EB.

(2) The sequencer circuit 31 outputs the NR-READ pulse in the second stage 352. The data stored in nonvolatile address register 33 is read and transferred to first address counter AU.

(3) The sequencer circuit 31 then outputs the RESET(AL) pulse in the third stage 353. The data stored in second address counter AL is reset to OHH designating a certain memory cell transistor to be refreshed.

(4) The sequencer circuit 31 outputs the READ pulse in the fourth stage 354. The read operation is triggered, which makes the data stored in the memory cell transistor designated by the address in first address counter AU and in second address counter AL being read and transferred to register 2.

(5) The sequencer circuit 31 outputs the SET pulse in the fifth stage 355. The set operation is triggered, which makes the data set in the register 2.

(6) The sequencer circuit 31 outputs the PROG. pulse in the sixth stage 356. The program operation is triggered to the memory cell transistor designated by the address in first address counter AU and in second address counter AL. The manner of the program operation is to over-program the same data already stored in the memory cell transistor putting the threshold voltage of the "0" cell, or programmed cell, higher. The threshold voltage of the "1" cell, or erased cell, is maintained at the same level. Therefore, data in the refreshed memory cell is enhanced.

(7) The sequencer circuit 31 outputs the INC(AL) pulse in the seventh stage 357. This triggers an increment of address data in the second address counter AL making the address designate the next memory cell transistor to be refreshed.

(8) The sequencer circuit 31, then in the eighth stage 358, compares the address data stored in second address counter AL to OOH. If the address data is equal to OOH, the refresh operation is to be finished going to the ninth stage 359. If not, the next refresh operation begins going to the fourth stage 354 again.

(9) The sequencer circuit 31 then outputs the INC(AL) pulse in the ninth stage 359. This triggers an increment of address data in first address counter AL making the address designate the next memory cell transistor to be refreshed.

(10) The sequencer circuit 31 outputs the NR-ERASE pulse in the tenth stage 360. The data in nonvolatile address register 33 is erased.

(11) The sequencer circuit 31 then outputs the NR-PROG. pulse in the eleventh stage 361. The data stored in first address counter AL is transferred to and saved in nonvolatile register 33.

As described above, in the third embodiment of this invention, the refresh controller 3 includes nonvolatile address register 33 for storing back-up address data for the address counter. The back-up address data is stored from the address counter to the nonvolatile address register after the refresh operation is finished and the back-up address data is loaded from the nonvolatile address register to the address counter before the refresh operation begins. Therefore, the nonvolatile address register holds, without power supply, the address data which designates the memory cell transistor to which the next refresh operation is conducted.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A nonvolatile semiconductor memory system comprising:

a memory cell array having a plurality of floating gate memory cell transistors arranged in a matrix of rows and columns with a plurality of bit lines connected to the drains of said floating gate memory cell transistors arranged in a same column and a plurality of word lines connected to the control gates of said floating gate memory cell transistors arranged in a same row, wherein said memory cell transistors are divided into plural erase blocks comprising plural of said memory cell transistors and plural refresh blocks comprising plural of said memory cell transistors and wherein the memory cell transistors of a respective erase block are addressed for erasing stored data and the memory cell transistors of a respective refresh block are independently addressed for refreshing of stored data; and a control means for controlling sequentially performing erasing and refreshing operations in which data stored in the floating gate memory cell transistors of a respective erase block are erased in said erasing operation and the data stored in the floating gate memory cell transistors of a respective refresh block are refreshed in said refreshing operation.

2. A nonvolatile semiconductor memory system according to claim 1, wherein said control means comprises:

register means connected to said bit lines for temporarily storing the data read from the memory cell transistors; and refresh control means for controlling a refresh operation including the steps of reading data from said floating gate memory cell transistors, storing said data in said register means, and over-programming said data to said floating gate memory cell transistors from which said data were read.

3. A nonvolatile semiconductor memory system according to claim 2, wherein said refresh control means further comprises address counter means for storing an address which designates the memory cell transistor to which the refresh operation is to be conducted.

4. A nonvolatile semiconductor memory system according to claim 3, wherein said refresh control means further comprises a nonvolatile address register means for storing back-up address data for said address counter means.

5. A nonvolatile semiconductor memory system according to claim 4, wherein said refresh control means comprises means for producing a first control signal to store the contents of said address counter means as address data to said nonvolatile address register means before a power down and a second control signal to transfer said address data stored in said nonvolatile address register means to said address counter means when power is restored after said power down.

6. A nonvolatile semiconductor memory system according to claim 4, wherein after said refresh operation and in the event of a power-loss and a subsequent power restoration, said refresh control means comprises means for producing control signals to transfer the address data stored in said nonvolatile address register means to said address counter means.

7. A nonvolatile semiconductor memory system according to claim 3, wherein each refresh block corresponds to a respective address of said address counter means.

8. A nonvolatile semiconductor memory system according to claim 7, wherein said refresh control means further comprising nonvolatile address register means for storing back-up address data for said address counter means.

9. A nonvolatile semiconductor memory system according to claim 7, wherein said refresh control means comprises means for producing a first control signal to store the contents of said address counter means as address data to said non-volatile address register means before a power down and a second control signal to transfer said address data stored in said nonvolatile address register means to said address counter means when power is restored after said power down.

10. A nonvolatile semiconductor memory system according to claim 7, wherein after said refresh operation and in the event of a power-loss and a subsequent power restoration, said refresh control means comprises means for producing control signals to transfer the address data stored in said nonvolatile address register means to said address counter means.

* * * * *